US007333623B2

(12) United States Patent

Neumann

(10) Patent No.: US 7,333,623 B2

(45) Date of Patent: Feb. 19, 2008

(54) METHOD FOR DYNAMIC DETERMINATION OF TIME CONSTANTS, METHOD FOR LEVEL DETECTION, METHOD FOR COMPRESSING AN ELECTRIC AUDIO SIGNAL AND HEARING AID, WHEREIN THE METHOD FOR COMPRESSION IS USED

(75) Inventor: Joachim Neumann, Hellerup (DK)

(73) Assignee: Oticon A/S, Smørum (DK)

( * ) Notice: Subject to any disclaimer, the term of this patent is extended or adjusted under 35 U.S.C. 154(b) by 536 days.

(21) Appl. No.: 10/509,282

(22) PCT Filed: Mar. 26, 2002

(86) PCT No.: PCT/DK03/00103

§ 371 (c)(1), (2), (4) Date: Sep. 28, 2004

(87) PCT Pub. No.: WO03/081947

PCT Pub. Date: Oct. 2, 2003

(65) Prior Publication Data

US 2005/0175198 A1 Aug. 11, 2005

(30) Foreign Application Priority Data

Mar. 26, 2002 (DK) ............................... 2002 00459

(51) Int. Cl.
*H03G 3/20* (2006.01)

(52) U.S. Cl. ........................ 381/312; 381/57; 381/321; 381/107

(58) Field of Classification Search .................. 381/56, 381/57, 110, 106, 104, 107, 312, 320, 321; 379/388, 390
See application file for complete search history.

(56) References Cited

U.S. PATENT DOCUMENTS

| | | | |
|---|---|---|---|
| 4,531,229 A | 7/1985 | Coultier | |
| 5,144,675 A | 9/1992 | Killion et al. | |
| 6,049,618 A | 4/2000 | Saltykov | |
| 6,198,830 B1 | 3/2001 | Holube et al. | |
| 6,298,139 B1 | 10/2001 | Poulsen et al. | |
| 2002/0154786 A1 * | 10/2002 | Waller, Jr. | 381/104 |
| 2003/0012392 A1 * | 1/2003 | Armstrong | 381/321 |

FOREIGN PATENT DOCUMENTS

| | | |
|---|---|---|
| GB | 2179810 | 3/1987 |
| WO | 9934642 | 7/1999 |

* cited by examiner

*Primary Examiner*—Sinh Tran
*Assistant Examiner*—Walter F Briney, III
(74) *Attorney, Agent, or Firm*—Dykema Gossett PLLC

(57) ABSTRACT

The invention provides a method for dynamic determination of time constants to be used in a detection of the signal level of an input signal of unknown level in an electric circuit, comprising the following steps:—feed the input signal through an auxiliary level detection means that is reacting faster to changes in the input sound signal level than the detection of the signal level as a whole,—feed either the input signal or the output of the auxiliary level detection means through a guided level detection means, which is arranged with a guided time constant, and where the guided level detection means outputs an estimate of the level of the input signal,—analyze the outputs of the auxiliary and the guided level detector means, determine the time constant of the guided level detection means based on this analysis.

9 Claims, 4 Drawing Sheets

METHOD FOR DYNAMIC DETERMINATION OF TIME CONSTANTS, METHOD FOR LEVEL DETECTION, METHOD FOR COMPRESSING AN ELECTRIC AUDIO SIGNAL AND HEARING AID, WHEREIN THE METHOD FOR COMPRESSION IS USED

AREA OF THE INVENTION

Compressors can be found in most modern hearing instruments. They provide a number of possible benefits for the hearing aid user:

Loudness compensation, the task of loudness compensation compressors is to crush the dynamics of the acoustical environment into the dynamics of the hearing impaired.

Reduction of upward spread of masking, low-frequency components of noise do not only mask low-frequency speech cues, but also reduce the audibility of high-frequency cues due to the upward spread of masking. A frequency-dependent compression can reduce this effect and thus increase speech intelligibility in noisy environments.

Listening comfort, compressors that reduce the level of loud sounds also increase the listening comfort without sacrificing the audibility of soft sounds.

Output-limiting systems, an output-limiting compressor is a good choice, since peak-clippers introduce a substantially greater amount of distortion.

Improvement of speech intelligibility, the appropriate amount of compression is sometimes found as a compromise between comfort (→ more compression) and speech intelligibility (→ less compression). However, compression can in some situations improve speech intelligibility by selectively amplifying consonants.

FIG. 1 shows a block diagram of a simple feed-forward compressor. The compressor comprises a level detector with output Ln, a compressor characteristic unit and a multiplier. The output signal of the compressor is obtained by multiplying the input signal with a time variant factor signal Fn, which depends both on the level of the input signal and on the compressor characteristic. An is the input signal, Cn is the compressed signal and Fn is the time variant gain factor.

The level detector produces a time variant signal that estimates the level of the input sound signal. This level estimate can e.g. be based on the low-pass filtered rectified input sound signal or on the low-pass filtered squared signal to estimate the root-mean square value of the signal. This estimate is called level detector amplitude in the following. Typically, this level detector amplitude is converted to a logarithmic dB scale. The level detector should on the one hand follow the instantaneous level of the input signal in order to allow for gain changes as a reaction to changes in the level of the input sound signal. The level detector should on the other hand be stable enough to limit the amount of distortion that is introduced when applying abrupt changes to the gain. The level detector thus determines the temporal properties and side effects of the compressor displayed in FIG. 1.

Most level detectors have both an attack time constant and a release time constant. These time constants determine how fast the level detector follows an increasing input sound level and a decreasing input sound level, respectively. When considering the various compressor implementations there is presently no perfect solution. Although a compressor shows the desirable effect in a measurement with an input signal that changes slowly in level ("steady-state measurement"), compressors show a different behavior in the case of dynamic input sound signals. In the case of strong compression (large compression ratios), the compressed signals suffer from audible side effects such as distortion and pumping. Furthermore, the effective compression is smaller than the static compression characteristic because fluctuations of the input sound signal that are fast in comparison to the attack and release time constants will be less compressed. The criteria for the selection of time constants are often unclear and the achieved effective compression is difficult to control.

The setting of the time constants in the level detector of a hearing instrument thus involves a compromise between the requirements of little distortion of speech and the protection of the hearing impaired from sudden intense sounds. Traditionally, a fast attack time is used to provide protection and a long release time is used to reduce distortion effects. This compromise is not ideal because (a) distortion of speech signals caused by the short attack time constants and (b) over-estimation of dynamic signals such as speech due to long release time constants. In addition, the user of a hearing instrument can in some cases hear that a background signal of constant level increases in intensity. This effect is caused by long release time constants resulting in a slow gain increase after a loud acoustical event.

BACKGROUND OF THE INVENTION

From EP 0732036 A1 an automatic regulation circuitry for hearing aids is known for a programmable hearing aid wherein an electronic signal processing circuit has a regulation circuit for continuously determining or calculating one or several percent values of the input signal based on a continuous analysis and evaluation of the frequency and/or amplitude distribution of the input signal. These percent values are directly or indirectly used as control signals for regulating the amplification and/or the frequency response of the electronic signal processing circuit.

Hearing aid level detectors are also known from U.S. Pat. No. 4,531,229 and U.S. Pat. No. 5,144,675 wherein a peak value detecting circuit is combined with an average value detecting circuit. The peak value detecting circuit provides adjustment with short time delays and the average value detecting circuit provides adjustment with long time delays. Heavy sound levels of short duration will quickly excite the peak value detecting circuit and provide a quick gain reduction, but after a heavy sound of longer duration which disappears, the gain is adjusted slowly as a function of the decreasing mean value and during a time interval thereafter there will be an insufficient amplification of weak signals.

From WO 99/34642 automatic gain control in a hearing aid is effected by detecting an input sound level and/or an output sound level and adapting the output sound level supplied by the hearing aid in response to the detected sound level by controlling the gain of the hearing aid towards an actual desired value of the output sound level. The gain control is effected at increases and decreases, respectively, of the input sound level by adjusting the gain towards the actual desired value with an attack time and a release time, respectively, which are adjusted in response to the detected sound level to a relatively short duration providing fast gain adjustment at high input and/or output sound levels and to a relatively long duration providing slow gain adjustment at low input and/or output sound levels.

From U.S. Pat. No. 6,198,830 a compressor and accompanying level detector is known, wherein the time constants of the level detector are set after conducting and analysis of the modulation frequency of the input signal in order to classify the input signal.

SUMMARY OF THE INVENTION

The object of the invention is to provide a method whereby attack and release times are calculated based on a simple calculation scheme, which is not particularly power consuming, and which insures attack and release time settings which gives a compressed signal, with the following properties:

- strongly reduced distortion;
- outstanding sound quality—also at very large compression ratios;
- small pumping effect;
- optimal protection against sudden transients
- little or no overestimation of dynamical or modulated signals.

In order to achieve this, the invention provides a method for dynamic determination of time constants to be used in a detection of the signal level of an input signal of unknown level in an electric circuit. The method comprises the following steps:

- feed the input signal through an auxiliary level detection means that is reacting faster to changes in the input sound signal level than the detection of the signal level as a whole,
- feed either the input signal or the output of the auxiliary level detection means through a guided level detection means, which is arranged with a guided time constant, and where the guided level detection means outputs an estimate of the level of the input signal,
- analyze the outputs of the auxiliary and the guided level detector means, determine the time constant of the guided level detection means based on this analysis.

The auxiliary detection means, which reacts faster than the system as a whole, will follow the level of the input signal more closely, where the guided level detector changes dynamic behavior based on the analysis of the outputs from the two level detectors. The overall output from the level detector is identical to the output signal from the guided level detector. Through this method, level detectors with various different characteristics can be realized based on how the relationship between the output from the two level detectors and the setting of the time constants of the guided level detector is defined. By analyzing the outputs from the two level detectors it is possible to obtain all the necessary information on the dynamic behavior of the input signal to set a time constant of the guided level detector, which will provide a attack and release time settings which gives a compressed signal which meets the objects of the invention.

Preferably the time constant of the auxiliary level detector is set to a fixed value that is substantially smaller than the time constant of the level detector as a whole.

One way of analyzing the outputs from the two level detectors could be to convert the output of both level detectors to a dB scale and then subtract the level of the guided level detector from the level of the auxiliary detector and determine the sign of this difference. A simple rule for setting the time constant of the guided level detector is to set a relatively long time constant when the sign is negative and a relatively short time constant when the sign is positive. When the sign of the subtracted value is negative, the signal level is falling, and a relatively long time constant may be used. And when the sign of the subtracted value is positive, the signal level is rising, and a relatively short time constant should be used. This very simple way does however not always produce optimal sound quality.

In an embodiment of the invention analysis of the outputs of the auxiliary and the guided level detector means comprises the following steps:

- convert the amplitude estimate of both level detectors to a level estimate on a dB scale
- determine the difference between the level of the auxiliary level detector and the level of the guided level detector, and
- determine the time constant of the guided level detector as a function of this level difference.

In this embodiment not only the sign of the difference between the levels of the two detectors is determined, but also the size of this difference is calculated and used to determine the time constant of the guided level detector.

It is preferred that the function that determines the time constant of the guided level detector outputs a time constant that is maximal at a zero difference between the level of the auxiliary level detector and the level of the guided level detector, and that is decreasing or constant for an increasing level difference.

When there is no difference between the auxiliary and the guided level detector the guided level detector is on target, and a relatively long time constant can safely be used in the guided level detector. But as soon as the level difference increases (whether it is a negative or positive difference) it is a sign, that a swift level change is taking place, and the time constants of the guided level detector should be regulated downwards so that the guided level detector may at a faster pace accommodate to the new situation in the input signal.

In a further aspect the invention comprises a method for detecting the level of a signal, which uses a time constant as determined above. This can simply be done by using the output from the guided level detector as an indication of the present signal level. Such a method of level detection will be smooth and fast, and will be able to track level changes both for falling and rising signal levels in a broad frequency range.

In a further aspect of the invention a method for compressing an electric audio signal is provided, which uses level detector method as defined above. Such a compression method will be capable of on-line compression of an audio signal without the usual problems of distortion and pumping due to the exact tracking of the signal level provided by the level detector.

The invention further concerns a hearing aid wherein a method for compression as defined above is used.

DESCRIPTION OF A PREFERRED EMBODIMENT

Figure 1:
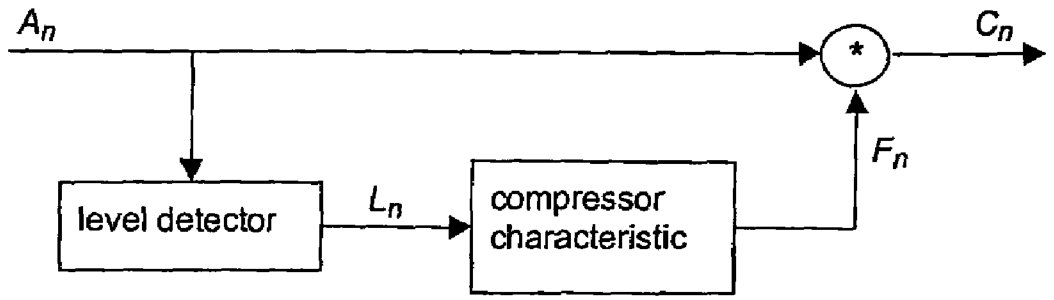
FIG. 1 shows a block diagram of the simple feed forward compressor according to the prior art, FIG. 2 displays a block diagram of the level detector according to the invention.
Figure 2:
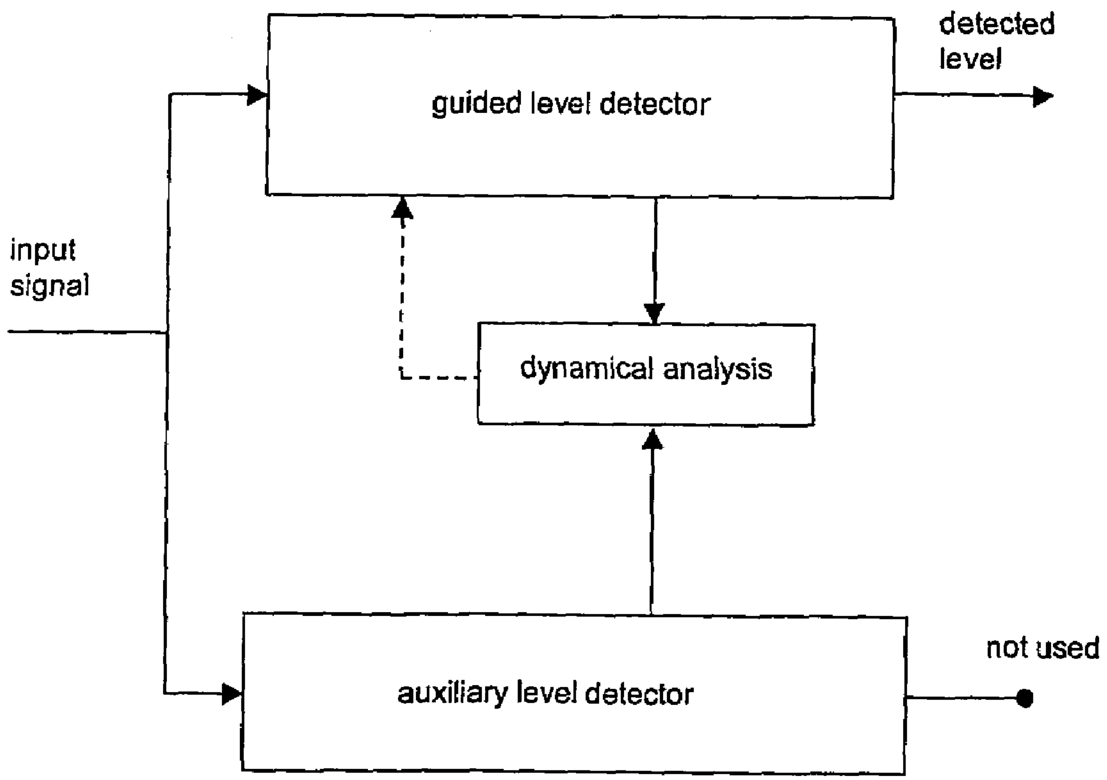

The method for level detection according to the invention is displayed in FIG. 2. The input signal is analyzed in two parallel level detectors: an auxiliary level detector and a guided level detector. The time constant of the auxiliary level detector is fixed. The time constant of the guided level detector is determined by the dynamical analysis. The dynamical analysis is based on the output of the auxiliary level detector and the output of the guided level detector. The output of this analysis determines at all times the time constant of the guided level detector and thus the dynamical behavior of the level detector as a whole.

Figure 4:
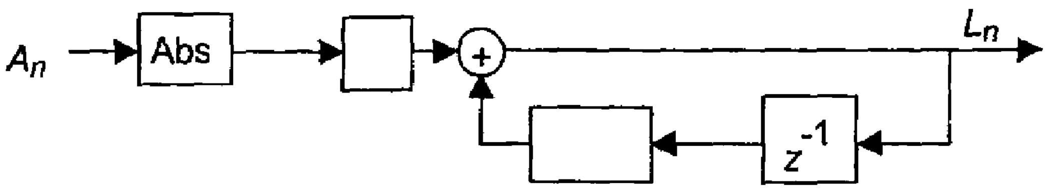

In an embodiment of the invention, the auxiliary and the guided level detector are implemented as a simple level detector as shown in FIG. 4. In the simple level detector, the input signal is rectified and filtered by a first order IIR filter. The single coefficient f of this IIR filter is directly related to the time constant $\tau$ of the simple level detector by the following relations:

$$\tau = \frac{-1}{fs \cdot \log(f)} \text{ and } f = e^{\frac{-1}{\tau \cdot fs}}.$$

In these equations, fs is the sampling frequency, f the IIR filter coefficient and $\tau$ is the internal time constant of the level detector.

Figure 3:
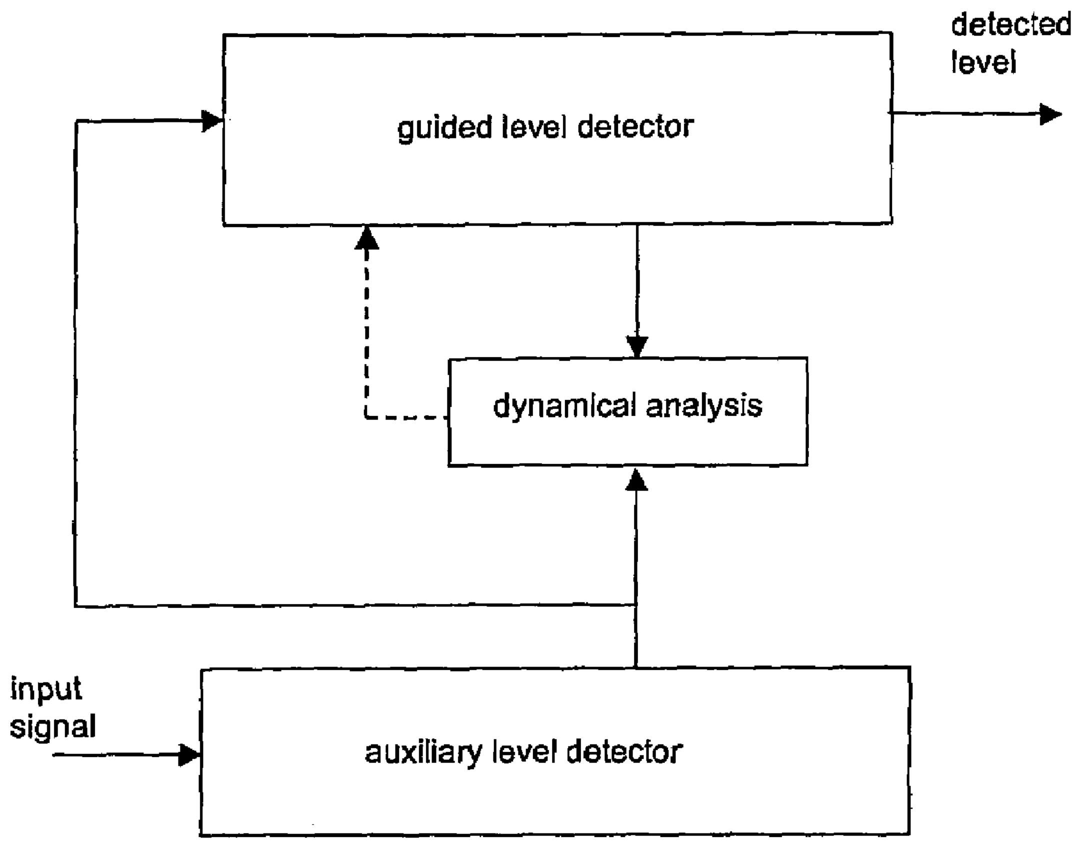
FIG. 3 shows a flow diagram of a version of the level detector according to the invention, FIG. 4 displays Block diagram of a simple level detector.

The auxiliary level detector has a fixed time constant. The time constant of the guided level detector is determined by the dynamical analysis as shown in FIG. 2 or 3. In FIG. 2 it can be seen that both the two level detectors in FIG. 2 receive the input signal, where as in FIG. 3 the guided level detector receives the output from the auxiliary detector as its input signal. The auxiliary level detector is however so fast compared to the dynamic range, which is required in the system that there is no significant practical difference between the two possibilities.

Figure 5:
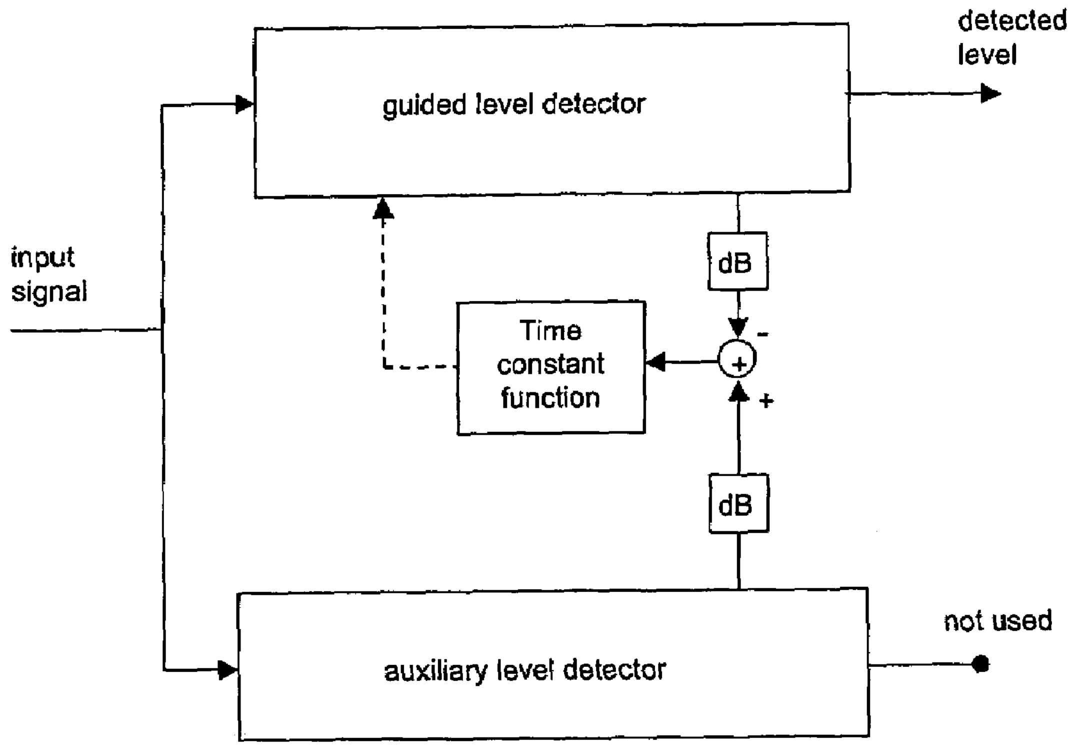
FIG. 5 is a flow diagram a level detector according to an embodiment of the invention.

In a preferred embodiment of the invention, the dynamical analysis is based on the difference between the level of the auxiliary and the guided level detector. This is shown in FIG. 5. Here, the difference between the level of the auxiliary level detector and the level of the guided level detector is used as input into a time constant function. The time constant function is used to determine the time constant of the guided level detector as function of the level difference of the auxiliary and the fast level detector.

The time constant function defines the time constant for the guided level detector for each possible value of a level difference. Positive level differences occur if the level of the auxiliary level detector is larger than the level of the guided level detector. This happens in the case of a raising input signal level. Negative level differences occur in the case of a falling input signal level. The output of the time constant function to positive and negative level differences thus corresponds to a whole spectrum of attack and release time constants.

Figure 6:
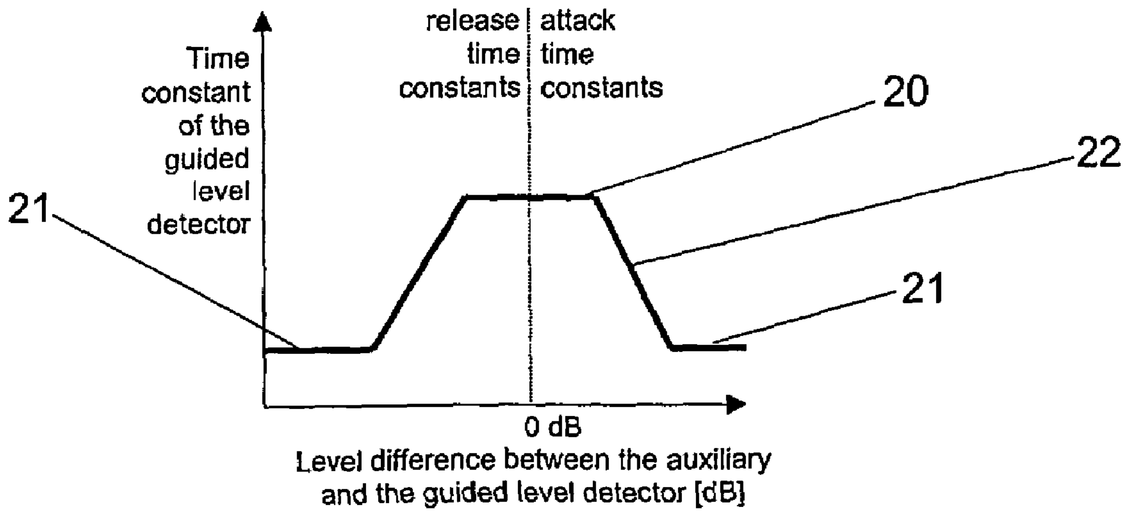
FIG. 6 is a diagram showing a possible relationship between the time constants of the guided level detector and the level difference between the auxiliary and the guided level detector.

A preferred embodiment of the time constant function is shown in FIG. 6. This time constant function defines an identical and large attack and release time constant in the case of a small level difference between the auxiliary and the guided level detector. This part of the function has designation sign 20. The large time constant assures a good sound quality in an acoustical environment with a rather stable sound level. In the case of a more dynamic acoustical environment—for example a slamming door or a sudden drop of the sound level, the difference between the auxiliary and the guided level detector will rise and the time constant function will consequently determine a smaller time constant for the guided level detector. This is shown by the parts 21 of the function shown in FIG. 6. Between those two levels of the time constant, the function may have a sloping course as shown at 22. The value of the time constants at 20 could lie in the range from 2 ms to 5 ms and the value of the time constants at 21 could lie in the range from 200 ms to 1000 ms. The level differences between the auxiliary and the guided level detector for which the time constant function determines a large time constant could typically be from −5 to 5 dB (the flat part 20 of the function) and from −15 to 15 for the short time constants (the flat parts 21 of the function). In the displayed example the function consists of straight line portions, but also functions with a curved course could be used.

If there is little dynamic behavior in the input signal, the difference between the auxiliary and the guided level detector will be small and a long time constant can be safely employed in the guided level detector. The resulting compressor then produces a very good sound quality. In moments of vigorous changes in the input sound level, side effects of abrupt gain changes might be masked by the natural dynamics of the input signal, since modifications of the temporal and spectral properties of the input signal due to rapidly changing amplification will be less noticeable in listening situations with an unsteady level than in listening situations with relatively constant level (such as steady speech or steady background noise). The fast and effectual reaction of the level detector according to the invention in the beginning of a vivid change in input level assures that the level detector can subsequently operate with a long time constant. The distortions of the compressor using the method of level detection according to the invention are beforehand a great deal smaller than the distortions of other compressors and the amplification changes smoothly in typical speech communication. Hence hearing impaired might tolerate greater compression ratios with a level detector according to the invention. It can thus be expected that a compressor using the level detection method of the invention can be operated even with extreme settings of the knee point and the compression ratio without modifying any compression parameters.

When doing a statistical analysis of the time constant of the level detector, wherein the function displayed in FIG. 6 is used, one can observe that (a) both the attack time constant (time constant of the level detector in reaction to an increase in input sound level) and the release time constant (time constant of the level detector in reaction to a decrease in input sound level) are not a single value, but reach from very large to very small time constants. The time constants are only rarely very short. This is because the compressor changes the amplification only then vigorously, when abrupt level changes in the input signal arise. In typical listening situations abrupt level changes occur only in a small fraction of the total duration.

A technical measurement of the amount of total harmonic distortion caused by a compressor utilizing the described level detector will show a very small distortion, since the level difference between the auxiliary and the guided level detector will be small in a measurement situation with a quasi static level-sweep.

Figure 7:
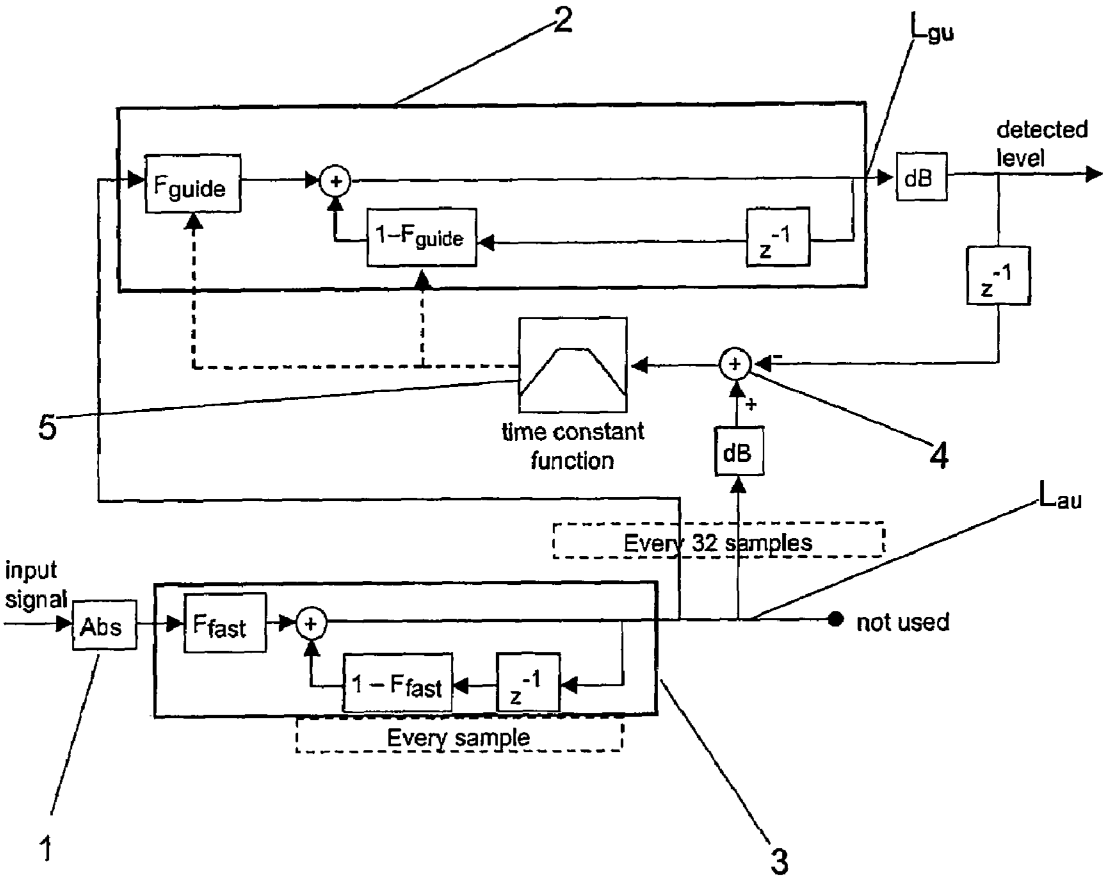
FIG. 7 shows the block diagram of a DSP implementation of the invention.

The invention is preferably implemented on a DSP hardware in a computationally effective manner as shown in FIG. 7 and described in the following. The auxiliary level detector is implemented with a fixed time constant of 2 ms. The input signal is sampled at a rate of 16.000 Hz. The auxiliary level detector is calculated for each sample of the incoming electric audio signal as the previously described simple level detector as shown in FIG. 4. The output of the auxiliary level detector is down sampled by a factor of 32. The down sampled output of the auxiliary level detector is used as input to the guided level detector, which is also implemented as the previously described simple level detector. The dynamic analysis is based on the difference of the levels of the auxiliary level detector and the guided level detector. This difference is then rounded to an integer dB value, which is used as index-lookup to determine the appropriate IIR coefficient of the guided level detector.

In box 1 the absolute value of each sample of the input signal is determined and this value is routed to the auxiliary detector 3. In the example of the invention shown in FIG. 7, the two level detectors 2 and 3 are of the same kind, but they need not be so. The output Lau from the auxiliary level detector (amplitude estimate) is converted to dB values to obtain a level estimate and the output Lgu from the guided level detector (amplitude estimate) are also converted into dB values to obtain a level estimate. At the subtraction point 4 the level of the guided level detector and the level of the auxiliary detector are subtracted. The output from the summation point 4 thereby is a measure of the size of the quotient between the amplitudes detected by the two level detectors. A measure for this value can be obtained in other ways, but the dB conversion and subtraction as described is easy and straightforward to implement in digital systems. This difference controls the transient time constant of the guided level detector 2 via the time constant function 5. The crucial element is the time constant function, which is based on the difference between the most recent value of the auxiliary level detector 3 and the previous value of the guided detector 2. In this structure it is the time constant function that directly determines the dynamical behavior of the guided level detector.

The speed of the level detector is usually an advantage, but in some applications eg in a hearing aid it can in some situations be a problem that the level detector tracks the changing levels of speech. The problem arises because speech contains small segments of no vocalization, and if a fast level detector is used there is a risk, that the background noise gets amplified during periods of no vocalazition, and this is annoying to the hearing aid user and may decries speech understanding when the hearing aid is used.

Figure 8:
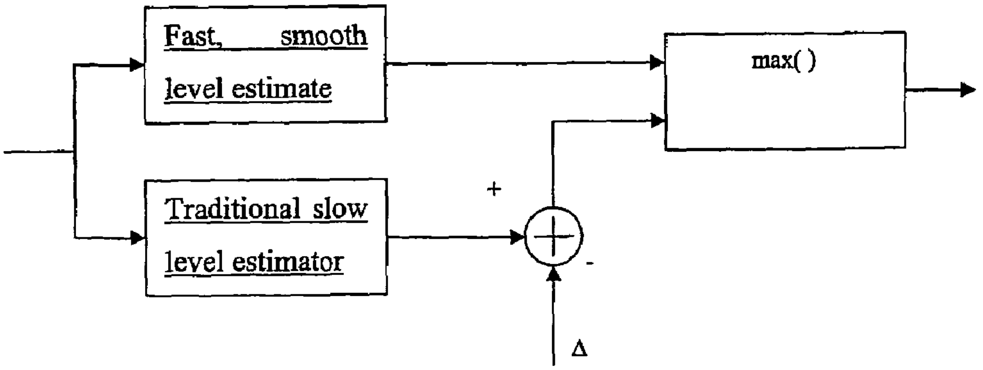
FIG. 8 shows a block diagram of an embodiment of the invention to be used in a hearing aid.

An embodiment of the invention is shown in FIG. 8 wherein a solution to this problem is proposed. The idea is to use the fast level detector according to the invention which tracks level differences between successive phonems, but still yields the estimate as a smooth function of time. In addition, a traditional slow level estimator is used in parallel to track the long term average level. From this average level, an offset value Δ, typically 15 dB, is subtracted to give a noise offset level and whereby the maximum of the noise offset level and the level from the fast level detector defines the level. This is shown in the diagram of FIG. 8. By subtracting the offset value and using the maximum value of the two, a noise flor is introduced in the speech pauses such that background noise in these pauses does not get amplified. On the other hand this scheme will not prevent the level detector from reacting fast to sudden increases in the signal level, and this is particularly important in relation to hearing aids.

The invention claimed is:

1. Method for dynamic determination of time constants to be used in a detection of the signal level of an input signal of unknown level in an electric circuit, comprising the following steps:

feeding the input signal through an auxiliary level detection means that reacts faster to changes in input sound signal level than detection of signal level as a whole, feeding either the input signal or output of the auxiliary level detection means through a guided level detection means which is arranged with a guided time constant, and where the guided level detection means outputs an estimate of the level of the input signal, analyzing the outputs of the auxiliary and the guided level detector means by converting an amplitude estimate of both level detectors to a level estimate on a dB scale, determining a difference between the level of the auxiliary level detector and the level of the guided level detector, and determining the time constant of the guide level detector as a function of the level difference, and determining the time constant of the guided level detection means based on this analysis.

2. Method as claimed in claim 1, where the time constant of the auxiliary level detector is set to a fixed value that is substantially smaller than the time constant of the level detector as a whole.

3. Method as claimed in claim 1, where the function that determines the time constant of the guided level detector outputs a time constant that is maximal at a zero differences between the outputs of the auxiliary level detector and the guided level detector, and that is decreasing or constant for an increasing absolute value of the level difference.

4. Method for level detection, wherein a time constant as determined in claim 1 is generated and used in the level detection.

5. Method for level detection as claimed in claim 4, wherein a traditional slow level estimator is used in parallel with the fast level detector to track the long term average level, whereby an offset value is subtracted this long term average level to define a noise offset level, and where the maximum of the noise offset level and the value from the fast level detector is output as the signal level.

6. Method for compressing an electric audio signal, which uses a method for level detection as defined in claim 4.

7. A method of determining levels of a speech in a hearing device in accordance with claim 6.

8. A method as claimed in claim 7 wherein the speech comprises successive phonemes, where the phoneme containing electrical signal is fed to the relatively fast auxiliary detection means providing a fast level estimate and to the relatively slower guided detection means providing a slow level estimate, where an offset value, typically 15 dB, is subtracted from the slow level estimate, and where the level of speech is determined by the maximum value of the fast and slow level estimates.

9. A method as claimed in claim 1, wherein said steps are conducted using a digital signal processor.

* * * * *

UNITED STATES PATENT AND TRADEMARK OFFICE

CERTIFICATE OF CORRECTION

PATENT NO. : 7,333,623 B2
APPLICATION NO. : 10/509282
DATED : February 19, 2008
INVENTOR(S) : Joachim Neumann It is certified that error appears in the above-identified patent and that said Letters Patent is hereby corrected as shown below:

Title Page, Please insert:

In the heading:

--(63) PCT Filed: Feb. 17, 2003--

Signed and Sealed this
Fourteenth Day of February, 2012

David J. Kappos

David J. Kappos
*Director of the United States Patent and Trademark Office*